(12) United States Patent
Lee et al.

(10) Patent No.: US 10,096,600 B2
(45) Date of Patent: *Oct. 9, 2018

(54) SEMICONDUCTOR DEVICE WITH METAL GATE

(71) Applicant: Taiwan Semiconductor Manufacturing Company, Ltd., Hsinchu (TW)

(72) Inventors: Da-Yuan Lee, Hsinchu County (TW); Kuang-Yuan Hsu, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 21 days.

This patent is subject to a terminal disclaimer.

(21) Appl. No.: 15/626,348

(22) Filed: Jun. 19, 2017

(65) Prior Publication Data

US 2017/0287913 A1  Oct. 5, 2017

Related U.S. Application Data

(60) Continuation of application No. 14/792,352, filed on Jul. 6, 2015, now Pat. No. 9,685,444, which is a division of application No. 13/245,581, filed on Sep. 26, 2011, now Pat. No. 9,076,889.

(51) Int. Cl.
| | |
|---|---|
| H01L 27/092 | (2006.01) |
| H01L 29/49 | (2006.01) |
| H01L 21/8238 | (2006.01) |
| H01L 29/78 | (2006.01) |
| H01L 29/66 | (2006.01) |
| H01L 29/51 | (2006.01) |

(52) U.S. Cl.
CPC .. *H01L 27/0922* (2013.01); *H01L 21/823842* (2013.01); *H01L 29/4966* (2013.01); *H01L 29/513* (2013.01); *H01L 29/517* (2013.01); *H01L 29/66545* (2013.01); *H01L 29/66553* (2013.01); *H01L 29/78* (2013.01)

(58) Field of Classification Search
CPC ......... H01L 21/8238; H01L 21/823431; H01L 21/82345; H01L 21/823828; H01L 21/823842; H01L 27/0922
See application file for complete search history.

(56) References Cited

U.S. PATENT DOCUMENTS

| | | |
|---|---|---|
| 5,960,289 A | 9/1999 | Tsui et al. |
| 6,110,842 A | 8/2000 | Okuno et al. |
| 6,258,673 B1 | 7/2001 | Houlihan et al. |
| 6,602,751 B2 | 8/2003 | Oohashi |
| 6,953,727 B2 | 10/2005 | Hori |
| 7,118,974 B2 | 10/2006 | Chen |
| 7,274,046 B2 | 9/2007 | Adam et al. |
| 7,381,608 B2 | 6/2008 | Brask et al. |

(Continued)

*Primary Examiner* — Jose R Diaz
(74) *Attorney, Agent, or Firm* — Haynes and Boone, LLP

(57) ABSTRACT

A semiconductor device including a first gate structure is disposed on the semiconductor substrate. The first gate structure includes a gate dielectric layer, a layer, a first work function metal, a second work function metal, and a fill metal. A second gate structure is also disposed on the semiconductor substrate. The second gate structure includes the gate dielectric layer, a second work function metal, and the fill metal. In an embodiment, the second gate structure also includes an etch stop layer.

20 Claims, 9 Drawing Sheets

(56) References Cited

U.S. PATENT DOCUMENTS

| | | | |
|---|---|---|---|
| 7,902,610 B2 | 3/2011 | Tai et al. | |
| 7,973,413 B2 | 7/2011 | Kuo et al. | |
| 8,298,894 B2 | 10/2012 | Lenski et al. | |
| 8,310,012 B2 | 11/2012 | Hwang et al. | |
| 8,329,546 B2 | 12/2012 | Lee et al. | |
| 8,361,848 B2 | 1/2013 | Lee et al. | |
| 8,525,232 B2 | 9/2013 | Nogami et al. | |
| 8,633,536 B2 | 1/2014 | Lee et al. | |
| 8,952,451 B2 | 2/2015 | Liao et al. | |
| 9,685,444 B2 * | 6/2017 | Lee | H01L 27/0922 |
| 2002/0004270 A1 | 1/2002 | Moriwaki et al. | |
| 2004/0140518 A1 | 7/2004 | Lee | |
| 2005/0014352 A1 | 1/2005 | Torii et al. | |
| 2010/0148274 A1 | 6/2010 | Tai et al. | |
| 2011/0159678 A1 | 6/2011 | Hsu et al. | |
| 2011/0256682 A1 | 10/2011 | Yu et al. | |
| 2012/0068261 A1 | 3/2012 | Kwon et al. | |

\* cited by examiner

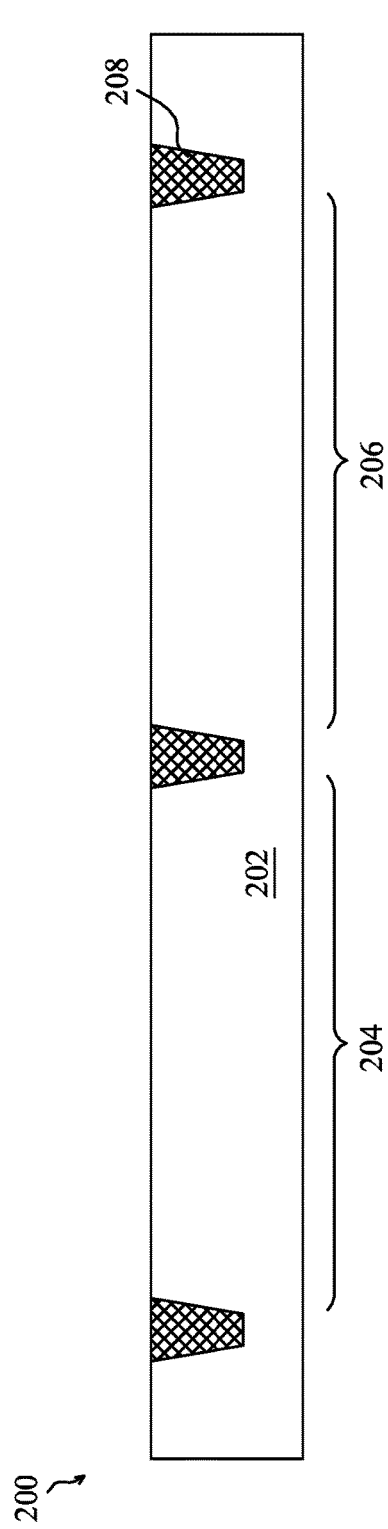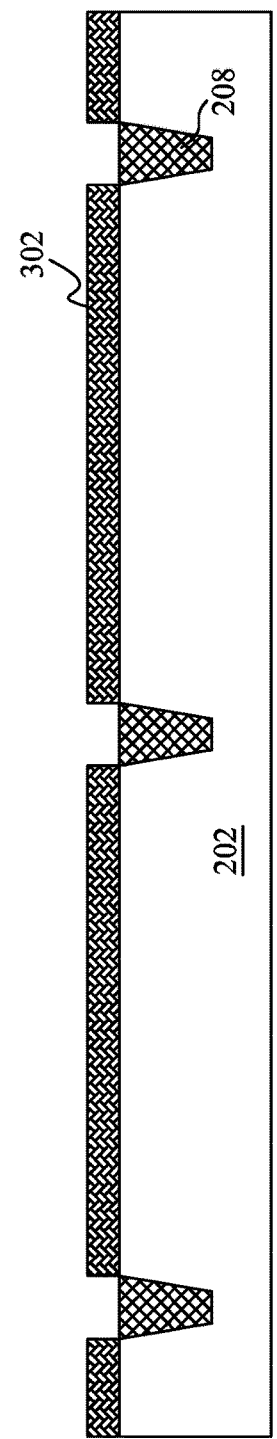

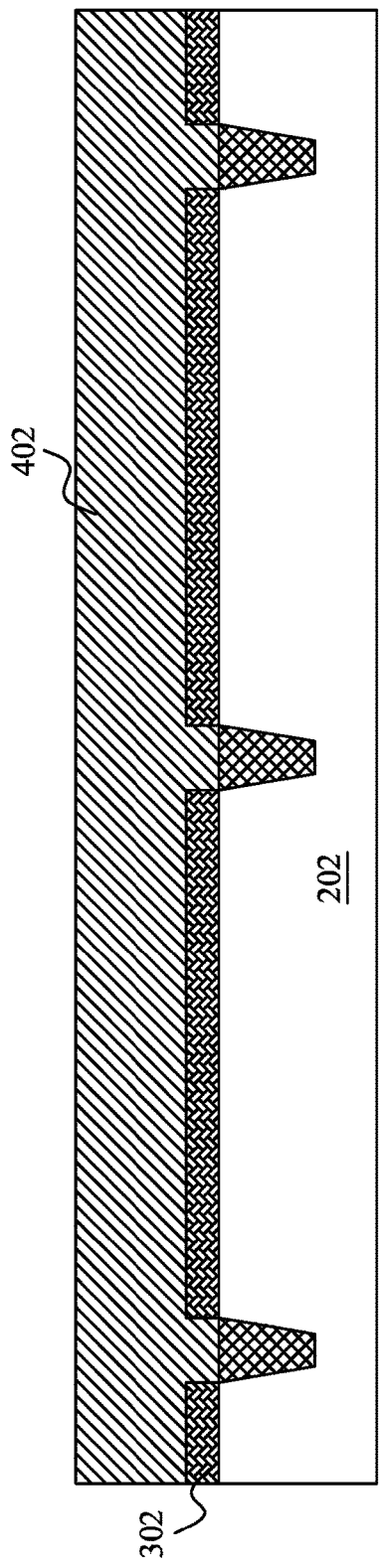
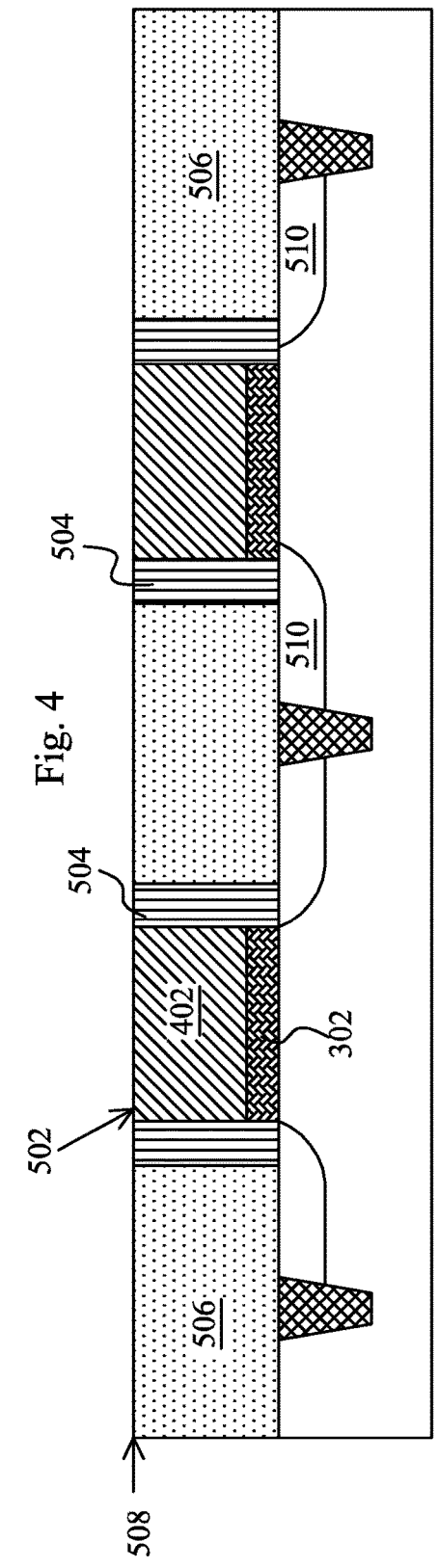

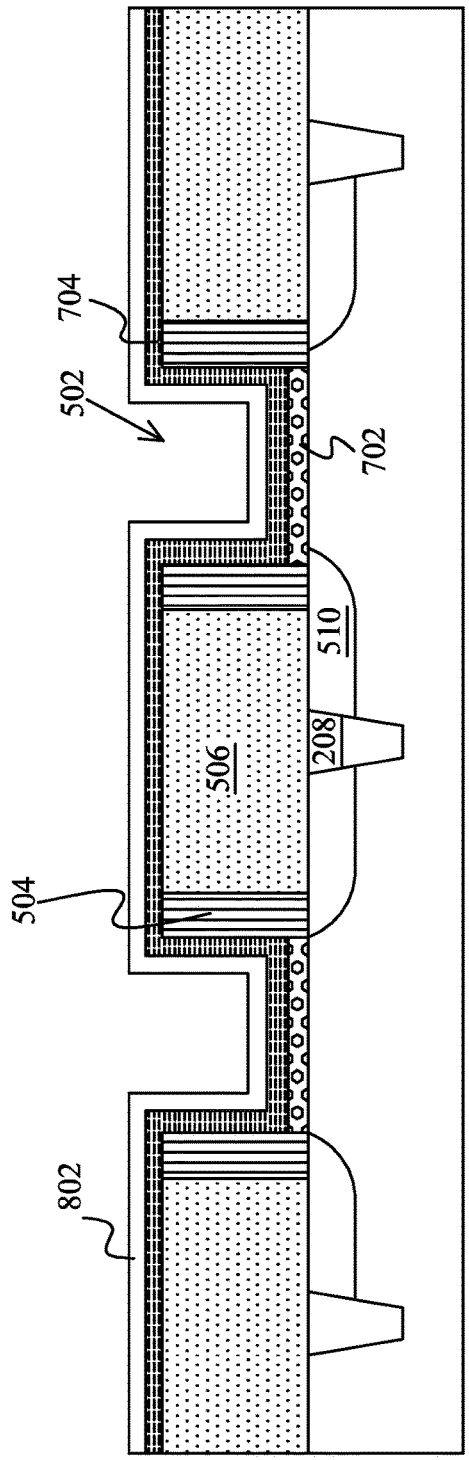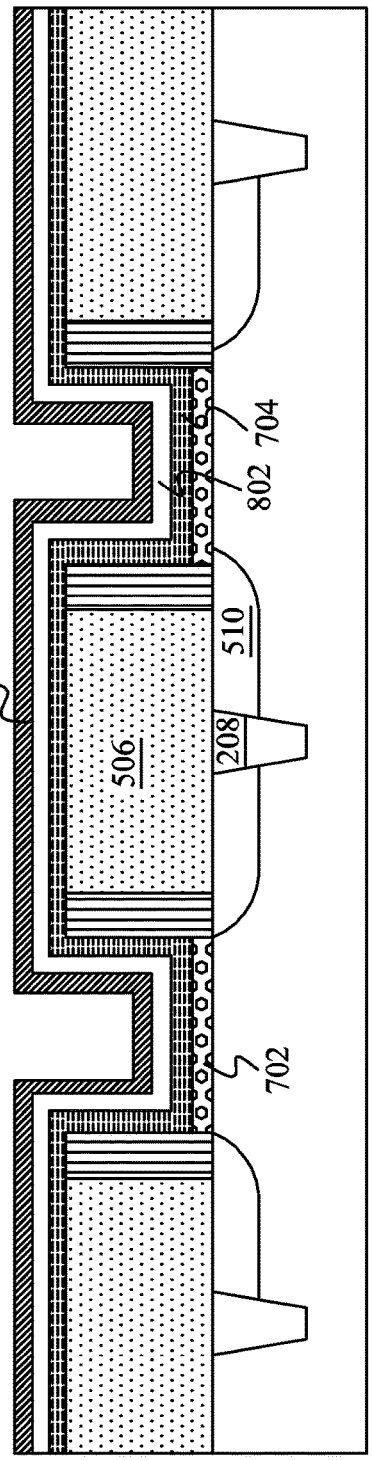
Fig. 8
Fig. 9

SEMICONDUCTOR DEVICE WITH METAL GATE

PRIORITY DATA

The present application is a continuation of divisional application of U.S. patent application Ser. No. 14/792,352 filed Jul. 6, 2015 and issuing as U.S. Pat. No. 9,685,444, which is a divisional of U.S. patent application Ser. No. 13/245,581, filed Sep. 26, 2011, which issued as U.S. Pat. No. 9,076,889, which are hereby incorporated by reference in their entireties.

BACKGROUND

The present disclosure relates generally to forming an integrated circuit device on a substrate and, more particularly, to forming a gate structure of a semiconductor device.

Semiconductor device geometries continue to dramatically decrease in size. Today's fabrication processes are routinely producing devices having feature dimensions less than 65 nm. However, solving the problems associated with implementing new process and equipment technology while continuing to satisfy device requirements has become more challenging. For example, metal-oxide-semiconductor (MOS) transistors have typically been formed with polysilicon gate electrodes. Polysilicon has advantageous thermal resistive properties and can allow for formation of self aligned source/drain structures.

However, in order to continually meet performance requirements, there has been a desire to replace the polysilicon gate electrode with a metal gate electrode. One process of implementing metal gates is termed a "gate last" or "replacement gate" methodology. In such a process, a dummy (e.g., sacrificial) polysilicon gate is initially formed, various processes associated with the semiconductor device are performed, and the dummy gate is subsequently removed and replaced with a metal gate. However, care must be taken during the process to provide the adequate work function of the resulting metal gate. Challenges also arise in the complexity and number of process steps required in the replacement gate technology. Thus, though the present methods and devices are in many ways sufficient and effective for their purposes, it is desired to simplify and/or improve the processes and resultant devices.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2-13 illustrate cross-sectional views of an embodiment of a semiconductor device corresponding to one or more of the steps of the method of FIG. 1.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Similarly, relative terms such as "above" or "below" and the like are provided for ease of description only and not intended to provide an absolute orientation (e.g., the device may be flipped such that the "top" becomes the "bottom"). Various features may be arbitrarily drawn in different scales for simplicity and clarity.

Figure 1:
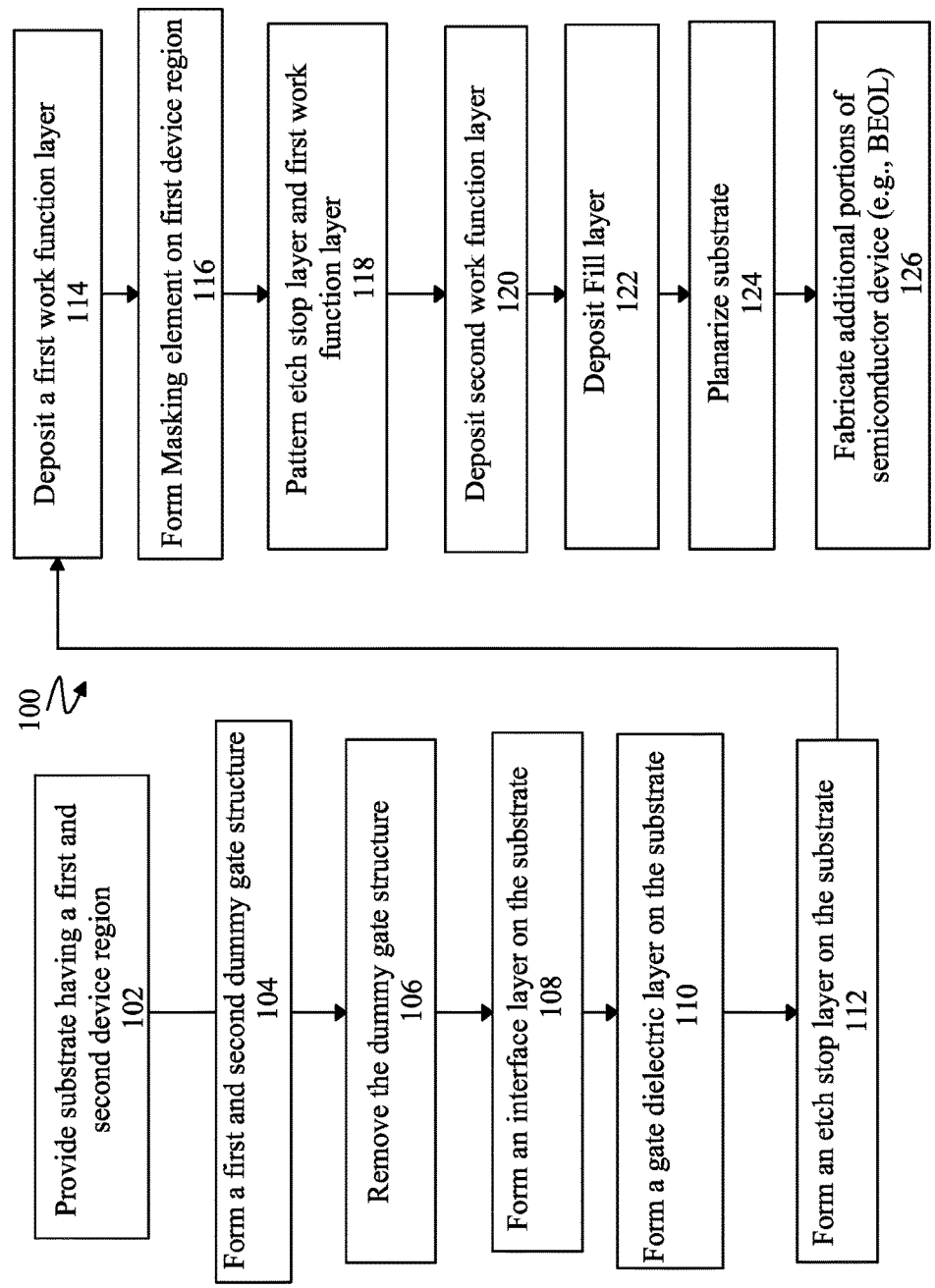
FIG. 1 is a flow chart illustrating an embodiment of a method of fabricating a semiconductor device according to one or more aspects of the present disclosure.
Figure 6:
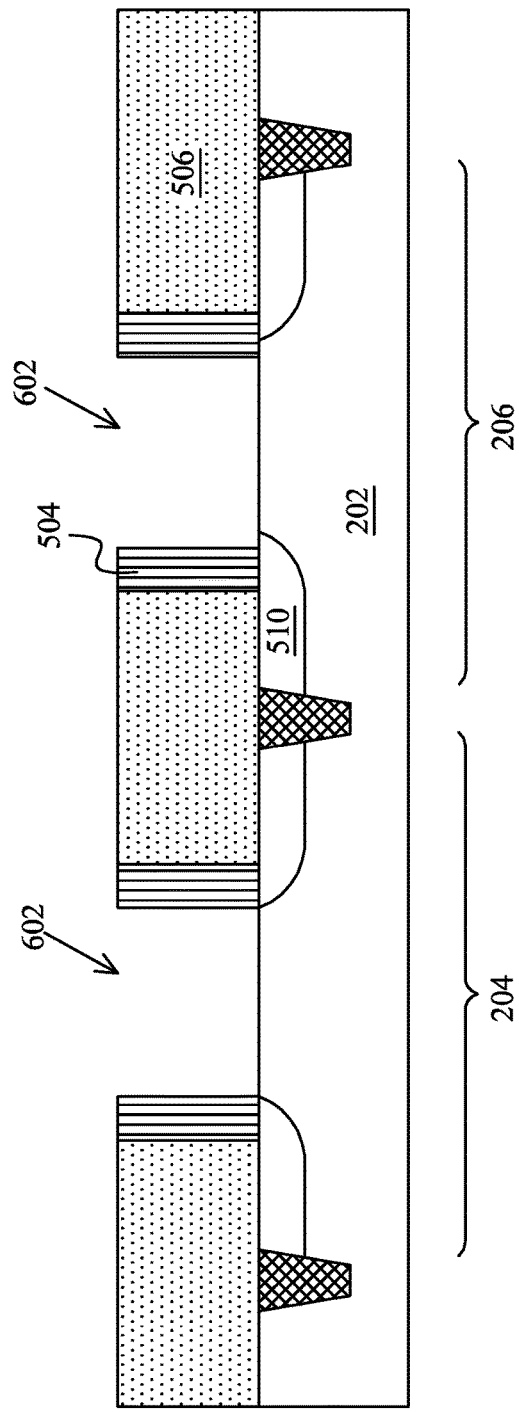
Figure 7:
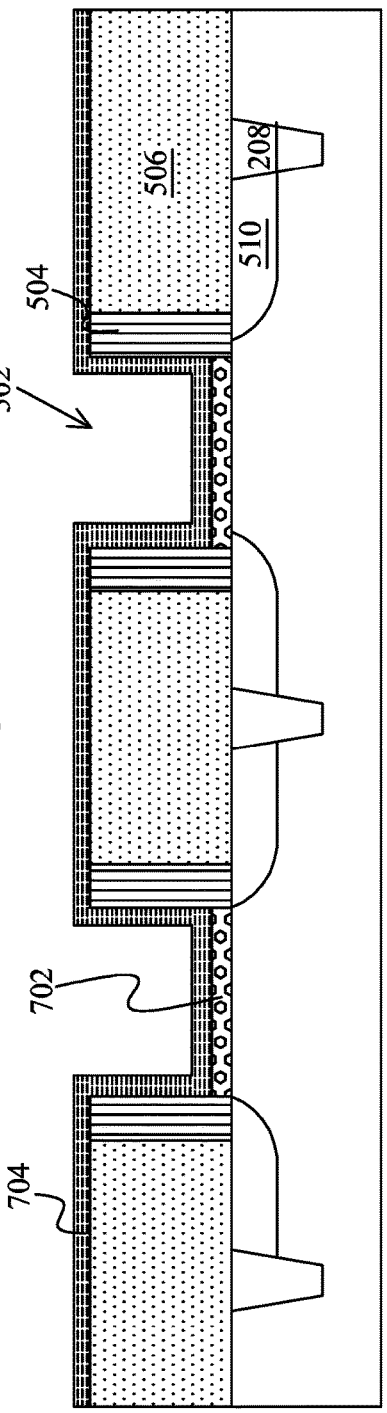
Figure 10:
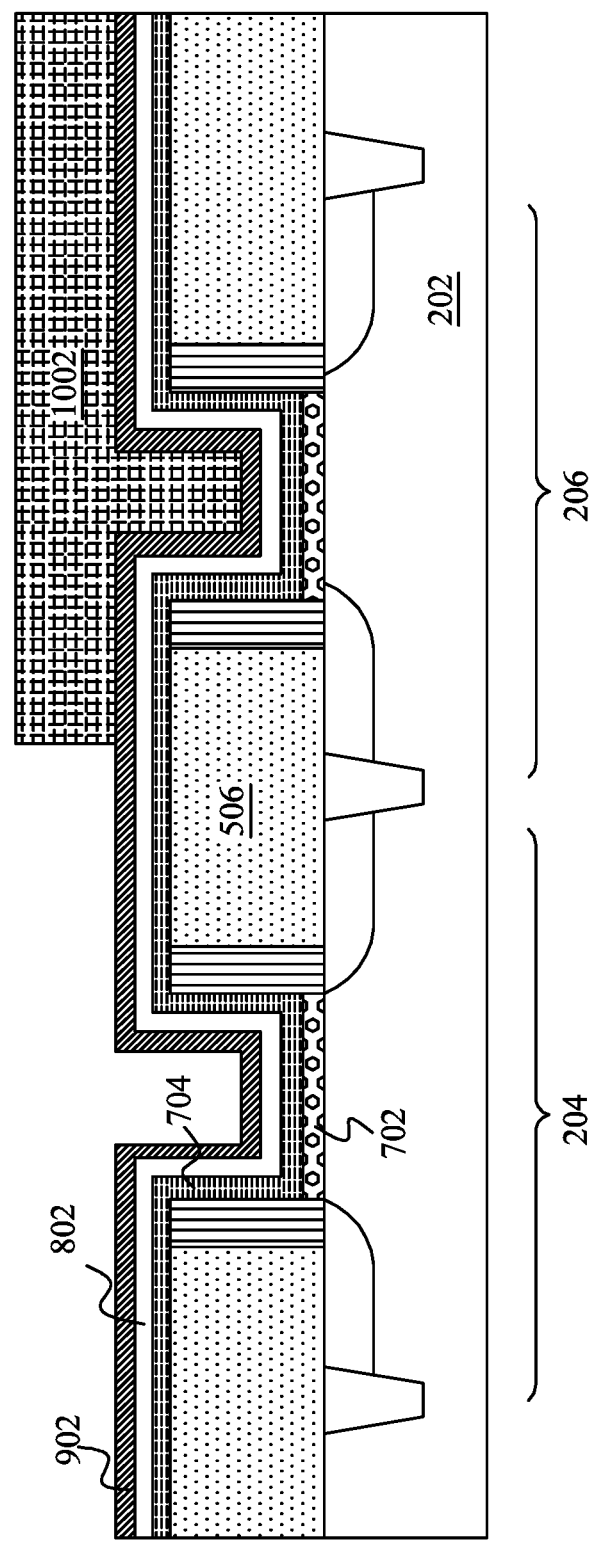
Figure 11:
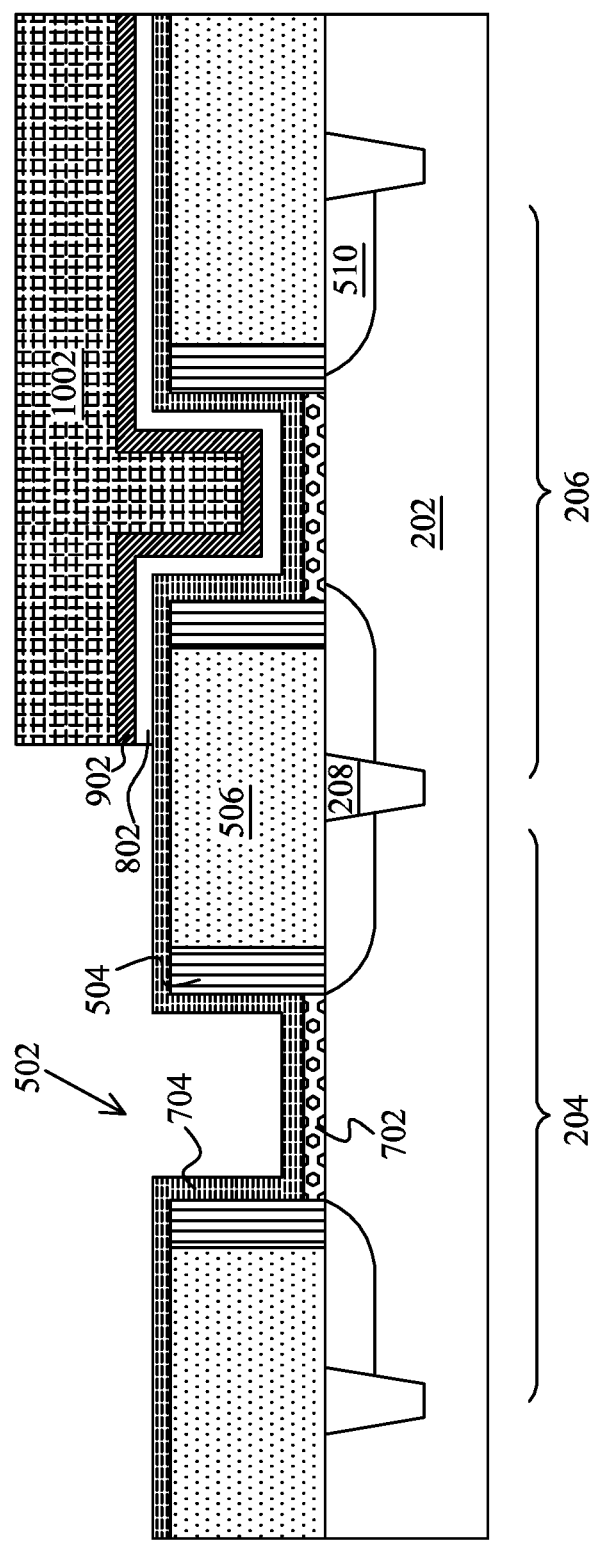

Referring to FIG. 1, illustrated is a method 100 for fabricating a semiconductor device using a gate last methodology. FIGS. 2-13 are cross-sectional views of a semiconductor device 200 at various stages of fabrication according to an embodiment of the method of FIG. 1.

It is understood that parts of the semiconductor device 200 may be fabricated by complementary metal-oxide-semiconductor (CMOS) technology process flow, and thus some processes are only briefly described herein. Further, the semiconductor device 200 may include various other devices and features, such as other types of transistors such as additional transistors, bipolar junction transistors, resistors, capacitors, diodes, fuses, etc., but is simplified for a better understanding of the inventive concepts of the present disclosure. The semiconductor device 200 includes a plurality of semiconductor devices (e.g., transistors), which may be interconnected.

The method 100 begins at block 102 where a semiconductor substrate is provided. The semiconductor substrate includes a plurality of device regions. In an embodiment, the plurality of device regions may be associated with different types of semiconductor devices. For example, a first region may include one of n-type or p-type field effect transistors. The second region may have the other one of n-type or p-type field effect transistors. In an embodiment, the devices of at least two of the regions of the plurality of regions are designed to have different gate stacks. For example, the devices of two different regions may be designed to have a different composition of layers including different work function, different thicknesses, etc.

The semiconductor substrate may be silicon substrate. Alternatively, the substrate comprises another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate is a semiconductor on insulator (SOI). In other alternatives, semiconductor substrate may include a doped epi layer, a gradient semiconductor layer, and/or a semiconductor layer overlying another semiconductor layer of a different type, such as a silicon layer on a silicon germanium layer. The substrate may include doped regions, such as a p-well, an n-well, or combination thereof.

Referring to the example of FIG. 2, a semiconductor substrate 202 is provided. The substrate 202 includes silicon. The substrate 202 includes a first region 204 and a second region 206. In an embodiment, the first region 204 includes a region where an n-type metal oxide semiconductor field effect transistor (NMOSFET) is formed. In an embodiment, the second region 206 includes a region where a p-type metal oxide semiconductor field effect transistor (PMOS-FET) is formed.

The semiconductor substrate 202 includes isolation structures 208 formed on the substrate 202 for isolating the regions of the substrate. The isolation structures 208 may be formed of silicon oxide, silicon nitride, silicon oxynitride, fluoride-doped silicate glass (FSG), a low-k dielectric material, and/or other suitable insulating material. The isolation structures 208 may be shallow trench isolation (STI) features, local oxidation (e.g., LOCOS), and/or other suitable isolation structures. In an embodiment, the isolation structures 208 are STI features and are formed by etching trenches in the substrate 202. The trenches may then be filled with isolating material, followed by a chemical mechanical polish (CMP).

The method 100 then proceeds to block 104 where dummy gate structures are formed. A dummy gate structure is a sacrificial structure provided in the place where metal gate will be subsequently formed. This process is typically known as a gate-last or replacement gate methodology. One or more dummy gate structures may be formed in both the first and second regions of the substrate.

In an embodiment, a gate dielectric is formed as part of the dummy gate structure and is itself a dummy (e.g., sacrificial) layer. The dummy gate dielectric may be a thermally grown oxide such as silicon dioxide (also referred to as silicon oxide). In an alternative embodiment of the method 100, the gate dielectric formed in block 104 may not be sacrificial but remain on the substrate (e.g., as in a high-k first, gate last process). In such an embodiment, the gate dielectric may be a high-k dielectric material. The high-k dielectric layer may include hafnium oxide ($HfO_2$). Alternatively, the high-k dielectric layer may optionally include other high-k dielectrics, such as $TiO_2$, $HfZrO$, $Ta_2O_3$, $HfSiO_4$, $ZrO_2$, $ZrSiO_2$, combinations thereof, or other suitable material. The high-k dielectric layer may be formed by atomic layer deposition (ALD) and/or other suitable methods.

Referring to the example of FIG. 3, a dummy gate dielectric layer 302 is formed on the substrate 202. In an embodiment, the dummy gate dielectric layer 302 is thermally grown silicon dioxide.

Block 104 further includes forming a dummy gate electrode as a portion of the dummy gate structure. The dummy gate electrode material is deposited, for example, by physical vapor deposition (PVD) or chemical vapor deposition (CVD). Exemplary materials for the dummy gate electrode include polysilicon and other types of silicon. Referring to the example of FIG. 4, illustrated is the semiconductor device 200 including a dummy gate material 402 formed on the substrate 202 and overlying the dummy gate dielectric 302. The dummy gate material 402 may be formed by PVD and CVD across the substrate 202. In an embodiment, the dummy gate material 402 is polysilicon.

The dummy gate material (e.g., dielectric and electrode) may then be patterned and etched into one or more dummy gate structures. Referring to the example of FIG. 5, a plurality of dummy gate structures 502 are formed (from the dummy gate material 402, described above with reference to FIG. 4 and the dummy gate dielectric 302, described above with reference to FIG. 3) on the substrate 202. The dummy gate structures 502 may be formed using suitable processes such as photolithography and etching processes (e.g., wet etch and/or dry etch).

In further processing in block 104, in an embodiment, spacer elements are formed on either side of the gate stack including dummy gate electrode as is known in the art. Referring to the example of FIG. 5, sidewall spacers 504 are formed adjacent the dummy gate structures 502. The sidewall spacers 504 may include silicon nitride, silicon oxide, silicon oxynitride, and/or other suitable dielectric materials. In embodiments, the sidewall spacers 504 include a plurality of layers, for example, liner layers.

In still further processing, in an embodiment of the method 100, an inter-layer dielectric (ILD) layer is formed on semiconductor substrate interposing the dummy gate structures. Referring to the example of FIG. 5, an ILD layer 506 is formed on the substrate 202. The ILD layer 506 may be formed by chemical vapor deposition (CVD), high density plasma CVD (HDP-CVD), spin-on deposition, physical vapor deposition (PVD or sputtering), or other suitable methods. The ILD layer 506 may include silicon oxide, silicon oxynitride, a low-k material, and/or other suitable dielectric. The ILD layer 506 may be conformably deposited on the substrate 202 and a CMP process performed. The dummy gate structure 502 may serve as a planarization stop for the CMP process. In other words, the CMP process may be stopped at the exposure of the top surface of the dummy gate structure. FIG. 5 illustrates the planarized surface 508.

As in typical fabrication, source/drain regions or portions thereof may be formed adjacent the dummy gate structures prior to the sidewall spacers and/or ILD layer being formed. Additional steps typical of a gate last or replacement gate process may be performed. The source/drain regions may be formed processes such as ion implantation, thermal diffusion, and/or other suitable processes. Referring to the example of FIG. 5, source/drain regions 510 are formed in the substrate 202. The source/drain regions may be suitably doped to provide the relevant conductivity. In an embodiment, the source/drain regions in the first region may provide the source/drain for an NMOSFET and be regions having an n-type dopant (e.g., n+ region). In an embodiment, the source/drain regions in the second region may provide the source/drain for a PMOSFET and be regions having a p-type dopant (e.g., p+ region).

The method 100 then proceeds to block 106 where the dummy gate structure is removed from the substrate. A dummy gate structure may be removed by an etching solution such as, for example, $NH_4OH$, dilute-HF, and/or other suitable etchant. In an alternative embodiment, the dummy gate structure may be removed by a suitable dry etching process. Example etchants include fluorine and/or chlorine based etchants. The removal of the dummy structure provides for openings within which a metal gate will be formed, as is typically performed in a replacement gate process. The dummy gate structure removal may include removing a dummy gate electrode and/or a dummy gate dielectric layer. Exemplary processes to remove the dummy gate dielectric layer include liquid or gas phase diluted HF. Referring to the example of FIG. 6, the dummy gate electrodes 502 (described above and illustrated in FIG. 5) have been removed from the substrate leaving openings (or trenches) 602.

The method 100 then proceeds to block 108 where an interfacial layer is formed on the substrate. The interfacial dielectric layer may include silicon oxide layer ($SiO_2$) or silicon oxynitride (SiON). In an embodiment, the interfacial dielectric has a thickness ranging from about 5 to about 15 angstroms. The interfacial dielectric layer may be formed by chemical oxidation, thermal oxidation, atomic layer deposition (ALD), CVD, and/or other suitable dielectric. In other embodiments, the interfacial layer is omitted. Referring to the example of FIG. 7, an interfacial layer 702 is formed on the substrate 202 in the openings 602.

The method 100 then proceeds to block 110 where a gate dielectric layer is formed on the substrate. The gate dielectric layer may include silicon dioxide or other suitable dielectric. In an embodiment, the gate dielectric is a high-k dielectric layer. (As noted above, in alternative embodiments, the method 100 may include a gate dielectric first process where the gate dielectric formed underlying the dummy gate electrode is not removed.) The high-k gate dielectric layer may be formed on each of the first and second regions of the substrate concurrently. In alternative embodiments, different dielectric materials may be used on the first and second regions. The high-k dielectric layer may include hafnium oxide ($HfO_2$). Alternatively, the high-k dielectric layer may optionally include other high-k dielectrics, such as $TiO_2$, HfZrO, $Ta_2O_3$, $HfSiO_4$, $ZrO_2$, $ZrSiO_2$, combinations thereof, and/or other suitable material. The gate dielectric layer may be formed by atomic layer deposition (ALD), chemical vapor deposition (CVD), physical vapor deposition (PVD), and/or other suitable methods. The gate dielectric layer may be between approximately 10 Angstroms and approximately 100 Angstroms in thickness. Referring to the example of FIG. 7, a high-k gate dielectric layer 704 is formed on the substrate 202.

The method 100 then proceeds to block 112 where an etch stop layer is formed on the substrate. The etch stop layer may be formed on the gate dielectric layer. In an embodiment, a blanket layer of material forming the etch stop layer is provided on the substrate. Subsequently, the etch stop layer may be patterned such that it is removed from one of the first and second regions on the substrate. In an embodiment, the etch stop layer is removed from the NMOSFET region of the substrate. In alternative embodiments, the etch stop layer remains, in full or in part, on NMOSFET and PMOSFET regions. In an embodiment, the etch stop layer is between approximately 5 and 50 Angstroms. Alternatively, the etch stop layer may be a p-type work function metal. In embodiments, the etch stop layer may be a mid-gap metal such as TiN, TaN, TixWy, W, and/or other suitable mid-gap metal. In an embodiment, the etch stop layer is TaN. Referring to the example of FIG. 8, an etch stop layer 802 is formed on the substrate 202.

The method 100 then proceeds to block 114 where a first work function metal is formed on the substrate. In an embodiment, the first work functional metal is a p-type work function metal or p-metal. In an alternative embodiment, the first work functional metal is an n-type work function metal. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, Al, TaAl, TaAlC, TiAlN, TaC, TaCN, TaSiN, Mn, Zr, other suitable n-type work function materials, or combinations thereof. A work function value is associated with the material composition of the work function layer, and thus, the material of the first work function layer is chosen to tune its work function value so that a desired threshold voltage Vt is achieved in the device that is to be formed in the respective region. The first work function layer may be deposited by CVD, PVD, and/or other suitable process. Referring to the example of FIG. 9, a work function layer 902 is disposed on the substrate 202. The work function layer 902 may be of a first type. In an embodiment, the work function layer 902 provides a p-type work function. Exemplary compositions for the work function layer 902 include, but are not limited to, TiN, TaN, $ZrSi_2$, $MoSi_2$, $TaSi_2$, $NiSi_2$, and WN. The work function layer 902 may be between approximately 10 Angstroms and approximately 100 Angstroms in thickness. The work function layer 902 may be chosen (e.g., material and/or thickness) such that it alone or in conjunction with the etch stop layer 802 provide a suitable work function for a semiconductor device in region 206 of the substrate 202. For example, in an embodiment, the work function layer 902 is chosen such that a suitable work function is provided for a PMOSFET semiconductor device.

The method 100 then proceeds to block 116 where a masking element is formed on the second device region. In an embodiment, the masking element includes photoresist. In an embodiment, the masking element is formed over the PMOSFET region. For example, the masking element may protect a p-type work function metal formed as described above with reference to block 114 in the PMOSFET region. In some embodiments, the masking element may include hard mask. An exemplary hard mask material is spin-on glass (SOG). In embodiments, the masking element may include ceramic, spin-on or chemical/physical deposition polymer, low melting point ceramic, and/or other suitable materials. Referring to the example of FIG. 10, a masking element 1002 is disposed on the second device region 206 of the substrate 202. The masking element 1002 may be a photoresist feature. The masking element 1002 may be formed by deposition of photoresist (e.g., spin-on) and photolithography processes to pattern the deposited photoresist including exposure, bake, development, and further bake and cleaning processes.

The method 100 then proceeds to block 118 where the first work function layer and/or etch stop layer are patterned. The masking element, described above with reference to block 116, may be used to protect the first work function layer on the second region of the substrate, while the work function layer is removed from the first region of the substrate. Likewise, the masking element, described above with reference to block 116, may be used to protect the etch stop layer on the second region of the substrate, while the etch stop layer is removed, partially or completely, from the first region of the substrate. In another embodiment, the etch stop layer remains on the first region of the substrate (in whole or in part). The first work function metal layer (e.g., p-type work function material) may be removed by dry etch and/or wet etch processes. Exemplary etches include a fluorine/chlorine based dry etch, an HCl wet etch, a $NH_4OH$ solution wet etch, and/or other suitable etchants. The etch stop layer may be removed by wet and/or dry etch processes. Exemplary processes include high temperature (e.g., approximately 25 to approximately 200 C) etches using HCl or NH4OH solution; however, numerous other embodiments are possible. The etching of the first work function layer and the etch stop layer may be provided in separate, distinct etching processes or performed concurrently. Referring to the example of FIG. 11, the work function metal 902 and etch stop layer 802 have been removed from the first device region 204 of the substrate 202. The masking element 1002 protects the second device region 206 during the removal, thus, the work function metal 902 and the etch stop layer 802 remain on the second device region 206. In alternative embodiments, some or all of the etch stop layer 802 remains on the first device region 204. In an embodiment, the work function metal 902 is a p-type work function metal and is removed from the first device region 204, which may be an NMOSFET region.

The masking element may then be removed by suitable processes after the patterning of the work function and/or etch stop layer. Removal processes include wet etch, dry etch, stripping, and/or other suitable processes.

The method 100 then proceeds to block 120 where the second work function layer is formed on the substrate. The second work function layer may be of opposite type than the first work function layer, described above with reference to block 114. In an embodiment, the second work function layer is an n-type work function layer. Exemplary n-type work function layers include TiAl, TaC, TaAlC, Ti, Ag, Al, TiAlN, TaCN, TaSiN, Mn, Zr, other suitable n-type work function materials. In alternative embodiments, the second work function layer is a p-type work function material (e.g., the first work function layer being n-type). The second work function layer may be deposited across the substrate, including the first and second regions (e.g., the NMOSFET and PMOSFET regions). The second work function layer may be deposited by CVD, PVD, and/or other suitable process.

Figure 12:
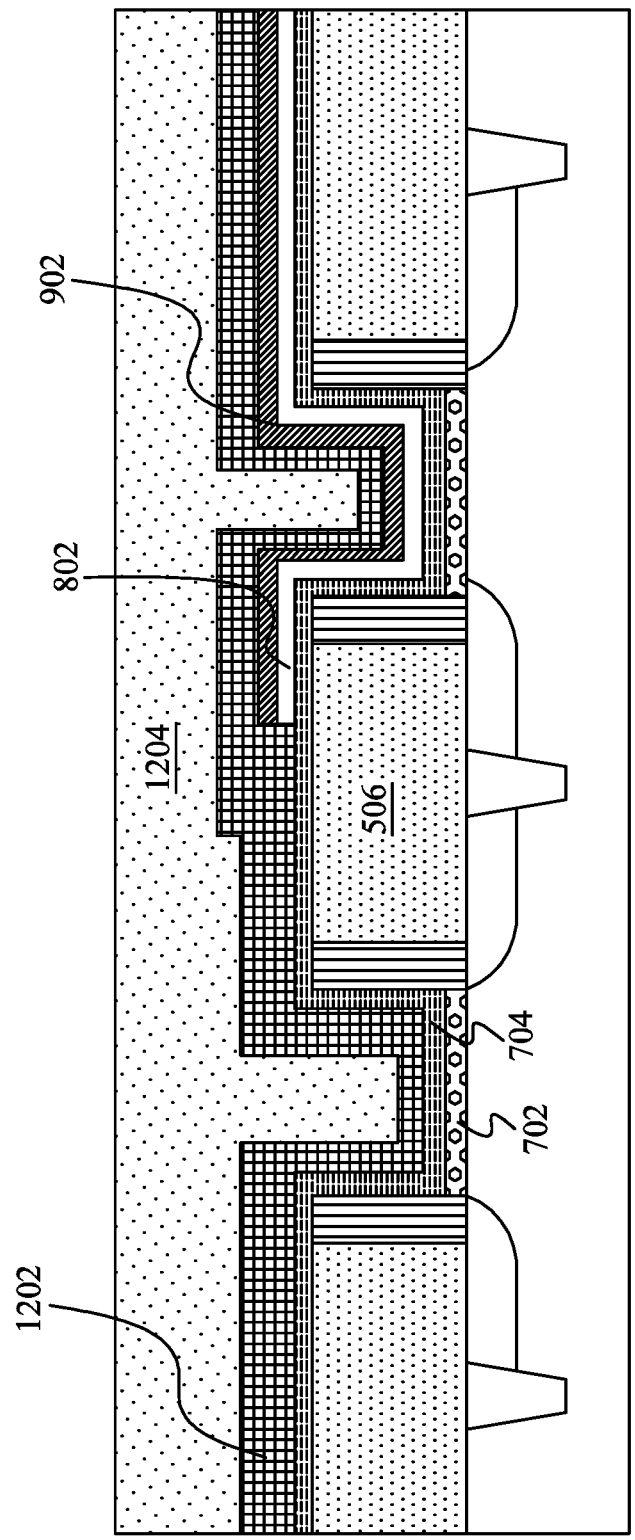

Referring to the example of FIG. 12, a second work function layer 1202 is disposed on the substrate 202. The second work function layer 1202 is provided in the first region 204 and the second region 206; however, other embodiments are possible. In an embodiment, the second work function layer 1202 is an n-type work function material and the first work function layer 902 is a p-type work function material. The work function layer 1202 may be between approximately 10 Angstroms and approximately 100 Angstroms in thickness.

The method 100 then proceeds to block 122 where a fill metal is deposited on the substrate. The fill metal layer may include Al, W, or Cu and/or other suitable materials. The fill metal may be formed by CVD, PVD, plating, and/or other suitable processes. The fill metal may be deposited over the work function metal layer(s), and thereby filling in the remaining portion of the trenches or openings formed by the removal of the dummy gate electrode. Referring to the example of FIG. 12, a fill metal 1204 is formed on the substrate 202. The fill metal 1204 fills the remainder of the opening 602, described above with reference to FIG. 6.

Figure 13:
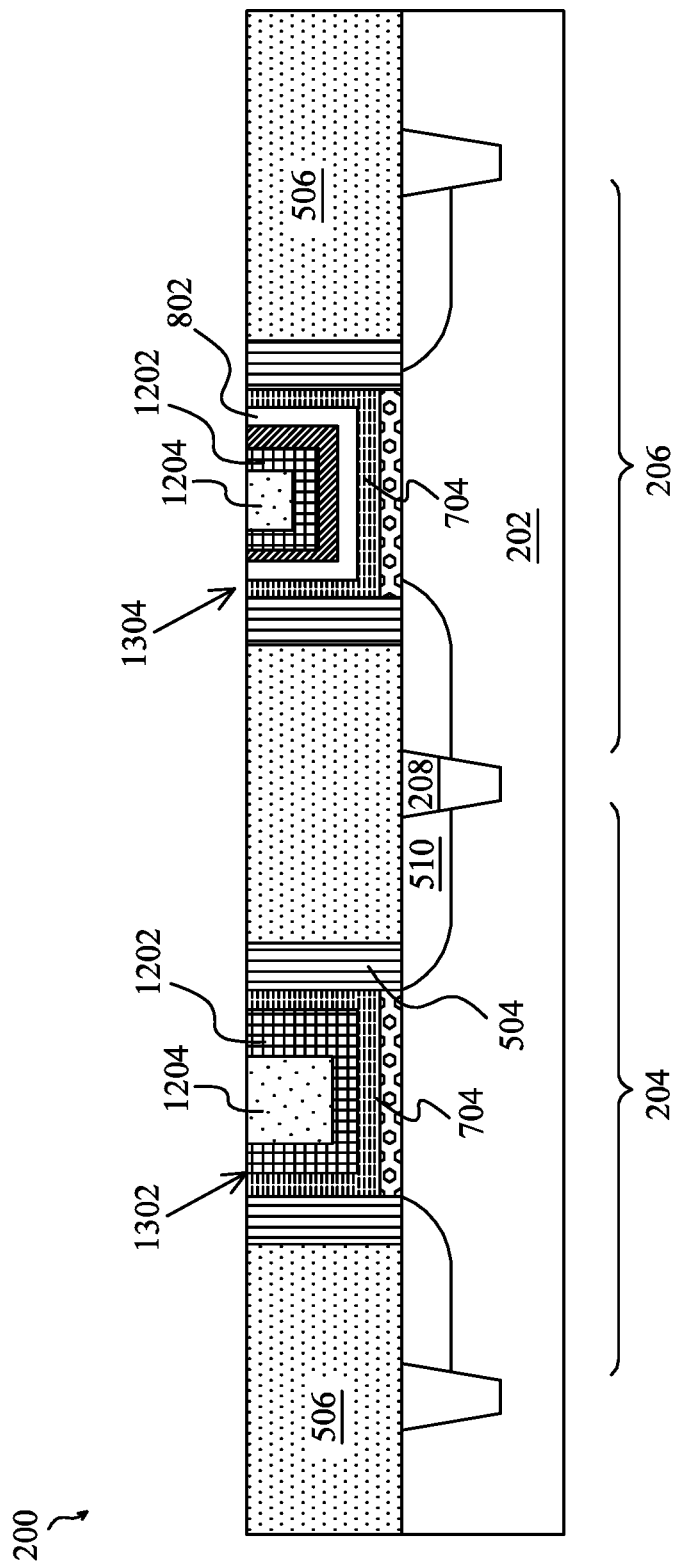

The method 100 then proceeds to block 124 where the substrate is planarized. In doing so, the excess material (e.g., fill metal, work function layer(s), gate dielectric, etch stop layer) may be removed from the top surface of the substrate (e.g., ILD layer) and remain in the openings provided by the dummy gate removal. Referring to the example of FIG. 13, the device 200 has been planarized such that the surface of the ILD layer 506 surface is exposed. Thus, the gate structure 1302 and gate structure 1304 are formed. In an embodiment, the gate structure 1302 provides the gate for an NMOSFET device. In an embodiment, the gate structure 1304 provides the gate for a PMOSFET device. As depicted in FIG. 13, the gate structure 1302 includes the interface layer 702, the gate dielectric layer 704, the second work function layer 12102 (e.g., n-metal) and the fill metal 1204. The gate structure 1304 includes the interface layer 702, the gate dielectric layer 704, the etch stop layer 802, the first work function layer 902, the second work function layer 1202 (e.g., n-type) and the fill metal 1204. In other embodiments, the gate structure 1302 may also include the etch stop layer 802.

The method 100 may then proceed to block 126 where formation of other features of the device not discussed in detail herein, such as, for example, back-end-of-the-line (BEOL) processing and features (multi-layer interconnects), contacts, and/or other suitable features as known in the art.

Thus, provided is a method for fabricating a semiconductor device. Embodiments of the method include providing a semiconductor substrate having a first opening and second opening. A dielectric layer is formed on the substrate including in the first and second openings. An etch stop layer is then formed on the dielectric layer in the first opening. Thereafter, a work function layer is formed on the etch stop layer. Finally, a fill metal is formed on the work function layer. The fill metal may fill the remaining of the first opening. In an embodiment, the stack of materials formed in the first opening forms a first gate (e.g., a gate for a PMOSFET).

In another embodiment described, a method of fabricating a semiconductor device is provided. The method includes forming a dummy gate structure on a first device region and implanting at least one of a source and a drain region adjacent the dummy gate structure. The dummy gate structure is removed after the implanting. A gate dielectric layer is then formed on the first device region after removing the dummy gate structure. An etch stop layer is formed on the gate dielectric layer and then a metal gate electrode on the etch stop layer, wherein the metal gate electrode includes a work function layer.

Further, a semiconductor device is provided. The device includes a semiconductor substrate. A first gate structure is disposed on the semiconductor substrate. The first gate structure includes a gate dielectric layer, an etch stop layer, a first work function metal, a second work function metal, and a fill metal. A second gate structure is also disposed on the semiconductor substrate. The second gate structure includes the gate dielectric layer, a second work function metal, and the fill metal. In an embodiment, the second gate structure also includes an etch stop layer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
   a first gate structure formed on a semiconductor substrate, wherein the first gate structure includes:
   a gate dielectric layer;
   a first layer over the gate dielectric layer, wherein the first layer includes a mid-gap metal;
   a first work function metal layer over the first layer;
   a second work function metal layer over the first work function metal layer; and
   a fill metal layer over the second work function metal layer; and
   a second gate structure formed on the semiconductor substrate, wherein the second gate structure includes:
   the gate dielectric layer, the second work function metal layer directly on the gate dielectric layer, and the fill metal layer.

2. The semiconductor device of claim 1, wherein the first work function metal layer is one of an n-type work function metal or a p-type work function metal and the second work function metal layer is the other of the n-type work function metal or the p-type work function metal.

3. The semiconductor device of claim 1, wherein the mid-gap metal is TiN.

4. The semiconductor device of claim 1, wherein the first work function metal layer includes TaN.

5. The semiconductor device of claim 1, wherein the mid-gap metal is TiN and wherein the first work function metal layer is TaN.

6. The semiconductor device of claim 1, wherein the first gate structure includes the gate dielectric layer directly interfacing the first layer, and the first layer directly interfacing the first work function metal layer.

7. The semiconductor device of claim 1, wherein the first gate structure includes the first work function metal layer disposed directly on the first layer.

8. The semiconductor device of claim 1, wherein the fill metal layer includes tungsten.

9. The semiconductor device of claim 1, further comprising:
sidewall spacers formed adjacent the first gate structure.

10. A device, comprising:
a PMOS gate structure including:
a gate dielectric layer;
a layer over the gate dielectric layer;
a first work function layer over the layer; and
a second work function layer over the first work function layer,
wherein the second work function layer is a different composition than the first work function layer; and
an NMOS gate structure including:
the gate dielectric layer; and
the second work function layer directly on the gate dielectric layer.

11. The device of claim 10, wherein the PMOS gate structure includes the layer disposed directly on the gate dielectric layer.

12. The device of claim 10, wherein the layer includes a mid-gap metal.

13. The device of claim 10, wherein the layer is comprised from a material selected from the group consisting of TiN, TaN, Ti$_x$W$_y$, W, or combinations thereof, where x and y are greater than 0.

14. The device of claim 10, wherein the gate dielectric layer is selected from the group consisting of TiO$_2$, HfZrO, Ta$_2$O$_3$, HfSiO$_4$, ZrO$_2$, ZrSiO$_2$, and combinations thereof.

15. The device of claim 10, wherein the layer includes TiN and the first work function layer includes TaN.

16. A device, comprising:
a first gate structure of a first type including:
a high-k gate dielectric layer;
a layer on the high-k gate dielectric layer, wherein the layer includes a mid-gap metal; and
a first work function layer interfacing the layer; and
a second gate structure of a second type including:
the high-k gate dielectric layer; and
a second work function layer interfacing the high-k gate dielectric layer, the second work function layer having a different work function than the first work function layer.

17. The device of claim 16, further comprising:
the second work function layer over the first work function layer in the first gate structure.

18. The device of claim 16, wherein the first work function layer is a p-type work function and the second work function layer is an n-type work function.

19. The device of claim 16, wherein the layer is directly on the high-k gate dielectric layer.

20. The device of claim 16, wherein the layer provides a work function to the first gate structure.

* * * * *